United States Patent
Ito (10) Patent No.: US 12,261,251 B2
(45) Date of Patent: Mar. 25, 2025

(54) SEMICONDUCTOR LIGHT-EMITTING DEVICE AND METHOD FOR MANUFACTURING SEMICONDUCTOR LIGHT-EMITTING DEVICE

(71) Applicant: STANLEY ELECTRIC CO., LTD., Tokyo (JP)

(72) Inventor: Yuichi Ito, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 485 days.

(21) Appl. No.: 17/845,909

(22) Filed: Jun. 21, 2022

(65) Prior Publication Data
US 2022/0416132 A1     Dec. 29, 2022

(30) Foreign Application Priority Data
Jun. 23, 2021 (JP) .................................. 2021-103965

(51) Int. Cl.
*H01L 33/50* (2010.01)
*H01L 33/00* (2010.01)
*H01L 33/62* (2010.01)

(52) U.S. Cl.
CPC ........ *H01L 33/505* (2013.01); *H01L 33/0095* (2013.01); *H01L 33/62* (2013.01)

(58) Field of Classification Search
CPC .... H01L 33/62; H01L 33/505; H01L 33/0095
See application file for complete search history.

(56) References Cited

U.S. PATENT DOCUMENTS

| 6,784,555 B2* | 8/2004 | Watson | H01L 24/32 257/788 |
|---|---|---|---|
| 2009/0214856 A1* | 8/2009 | Gomi | B29C 65/4845 156/60 |
| 2018/0130930 A1* | 5/2018 | Tachibana | H01L 33/60 |
| 2018/0175265 A1* | 6/2018 | Kim | H01L 33/60 |
| 2019/0157521 A1* | 5/2019 | Harada | F21S 41/141 |
| 2022/0216379 A1* | 7/2022 | Nakajima | C08J 5/18 |

FOREIGN PATENT DOCUMENTS

JP        2010219324 A    9/2010

* cited by examiner

*Primary Examiner* — Mark W Tornow
(74) *Attorney, Agent, or Firm* — Holtz, Holtz & Volek PC (57) ABSTRACT

A semiconductor light-emitting device includes: a substrate having a wiring electrode; a semiconductor light-emitting element mounted on the wiring electrode and having a light-emitting functional layer with an upper surface exposed; a wavelength conversion plate mounted on the light-emitting functional layer and being made of a sintered body including fluorescent material particles and binder particles; and an adhesive layer including a resin medium for adhering a light-incident surface of the wavelength conversion plate to a light output surface of the light-emitting functional layer, and resin particles dispersed in the resin medium. The light-incident surface can expose a sintered surface of the sintered body with a concave portion, and the resin particles are fitted in the concave portion and compressively deformed. The semiconductor light-emitting device is capable of reducing the heat generated from the wavelength conversion plate and of maintaining the high light output.

18 Claims, 6 Drawing Sheets

SEMICONDUCTOR LIGHT-EMITTING DEVICE AND METHOD FOR MANUFACTURING SEMICONDUCTOR LIGHT-EMITTING DEVICE

This application claims the priority benefit under 35 U.S.C. § 119 of Japanese Patent Application No. 2021-103965 filed on Jun. 23, 2021, which is hereby incorporated in its entirety by reference.

TECHNICAL FIELD

The presently disclosed subject matter relates to a semiconductor light-emitting device including a light-emitting element and a method for manufacturing the same.

BACKGROUND ART

Conventionally known light-emitting devices include a substrate in which a conductive pattern such as with terminals and wiring is provided, a light-emitting element with a semiconductor light-emitting layer mounted on the substrate, and a wavelength converter configured to convert the wavelength of light emitted from the light-emitting element.

For example, Japanese Patent Application Laid-Open No. 2010-219324 discloses a light-emitting device including a substrate, a light-emitting element mounted on the substrate, a polycrystalline light-transmitting member including a fluorescent material as a wavelength conversion material, and a light-guiding member configured to firmly fix the light-emitting element and the light-transmitting member.

In the light-emitting device described in the aforementioned patent literature, the light-transmitting member is heated by heat generated when the fluorescent material converts the wavelength of light emitted from the light-emitting element. When the light-transmitting member is heated, there is a possibility that temperature quenching occurs in which the intensity of the fluorescence emitted from the fluorescent material decreases, and the light output of the semiconductor light-emitting device decreases.

SUMMARY

The presently disclosed subject matter was devised in view of these and other problems and features in association with the conventional art. According to an aspect of the presently disclosed subject matter, a semiconductor light-emitting device is provided which is capable of reducing the heating of the wavelength converter during operation of the semiconductor light-emitting device, and of suppressing a decrease in the light output of the semiconductor light-emitting device. Also provided is a manufacturing method thereof.

According to another aspect of the presently disclosed subject matter, a semiconductor light-emitting device can include: a substrate having a wiring electrode; a semiconductor light-emitting element, which is mounted on the wiring electrode of the substrate, that has a light-emitting functional layer with an upper surface exposed; a wavelength conversion plate, which is mounted on the light-emitting functional layer of the semiconductor light-emitting element, that is made of a sintered body including fluorescent material particles and binder particles; and an adhesive layer including a resin medium, which is configured to adhere the wavelength conversion plate on a side of a light-incident surface thereof to the light-emitting functional layer of the semiconductor light-emitting element on a side of a light output surface thereof, and resin particles dispersed in the resin medium. In this semiconductor light-emitting device, the light-incident surface of the wavelength conversion plate can expose a sintered surface of the sintered body with a concave portion, and the resin particles are fitted in the concave portion of the light-incident surface of the wavelength conversion plate and compressively deformed.

In the semiconductor light-emitting device with the above-described configuration, the wavelength conversion plate can have a facet in the light-incident surface.

In the semiconductor light-emitting device with the above-described configuration, the concave portion of the light-incident surface of the wavelength conversion plate can have a surface defining a polyhedron space.

In the semiconductor light-emitting device with the above-described configuration, the resin particles can have a density and a refractive index, and at least one of the density and the refractive index can be greater than that of the resin medium.

In the semiconductor light-emitting device with the above-described configuration, the resin particles and the resin medium are made of the same resin, and preferably a silicone resin.

In the semiconductor light-emitting device with the above-described configuration, an average particle diameter of the resin particles can be 1/5 to 1/1 of a surface roughness (Rz) of the wavelength conversion plate.

According to still another aspect of the presently disclosed subject matter, a method for manufacturing a semiconductor light-emitting device can include: a substrate preparation step of preparing a substrate having a wiring electrode; an element bonding step of bonding a semiconductor light-emitting element on the wiring electrode of the substrate; an adhesive coating step of applying an adhesive resin, which includes an uncured thermosetting resin medium having fluidity, and cured thermosetting resin particles dispersed in the resin medium, to an upper surface of the semiconductor light-emitting element; a wavelength conversion plate mounting step of mounting and pressing a wavelength conversion plate, made of a sintered body including fluorescent material particles and binder particles, on the adhesive resin, the wavelength conversion plate having a concave portion of a sintered surface on a surface opposite to the semiconductor light-emitting element; and a wavelength conversion plate bonding step of thermally curing the resin medium to bond the wavelength conversion plate and the semiconductor light-emitting element. In this method, the wavelength conversion plate mounting step can include pressing the wavelength conversion plate from above in order to fit the resin particles into the concave portion of the wavelength conversion plate and compressively deforming the resin particles.

In the method for manufacturing a semiconductor light-emitting device with the above-described configuration, the resin particles can be dispersed in the resin medium in a mass concentration of 1 wt % to 5 wt %.

In the method for manufacturing a semiconductor light-emitting device with the above-described configuration, the resin particles can have a smaller elastic modulus than those of the semiconductor light-emitting element and the wavelength conversion plate, and can be dispersed in the resin medium.

In the method for manufacturing a semiconductor light-emitting device with the above-described configuration,

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to semiconductor light-emitting devices of the presently disclosed subject matter with reference to the accompanying drawings in accordance with exemplary embodiments. In the following description and the accompanying drawings, substantially identical or equivalent parts/components are denoted by the same reference numerals. In the following description, for example, the expression "Material 1/Material 2" indicates a laminated structure in which the material 2 is layered on the material 1. The expression "Material 1-Material 2" indicates an alloy including the materials 1 and 2.

First Embodiment

Figure 1:
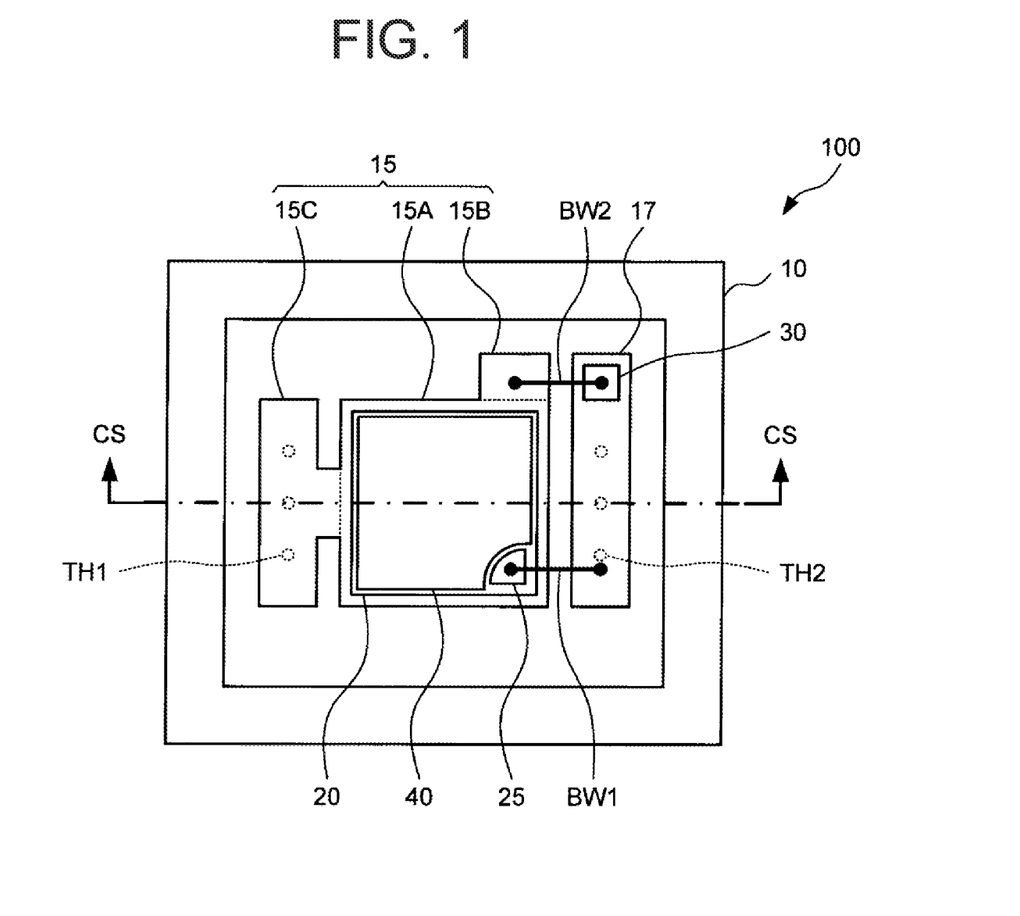
FIG. 1 is a top view of a light-emitting device according to an embodiment made in accordance with principles of the presently disclosed subject matter.
Figure 2:
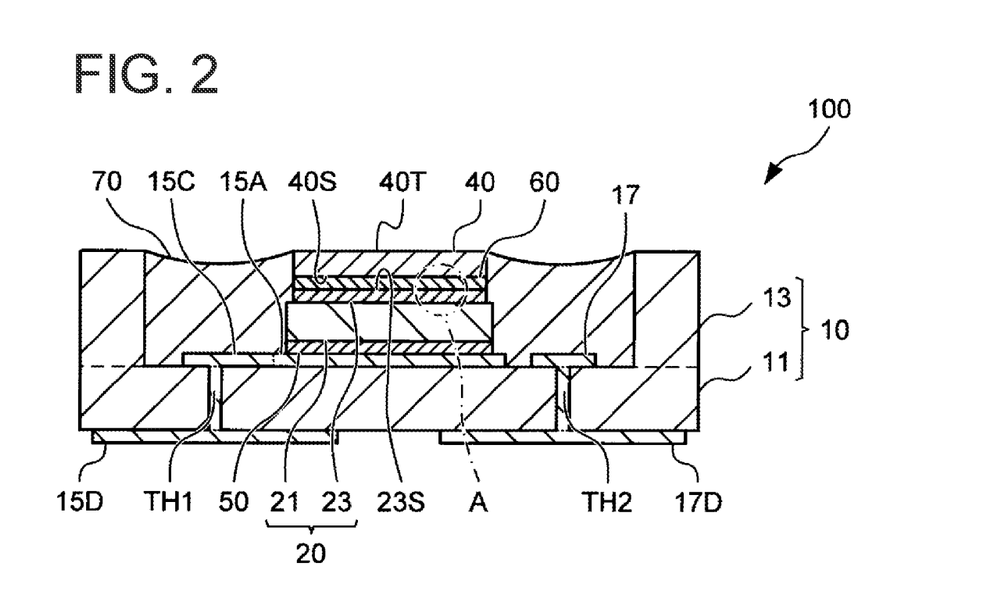
FIG. 2 is a cross-sectional view of the light-emitting device according to the embodiment illustrated in FIG. 1.
Figure 3:
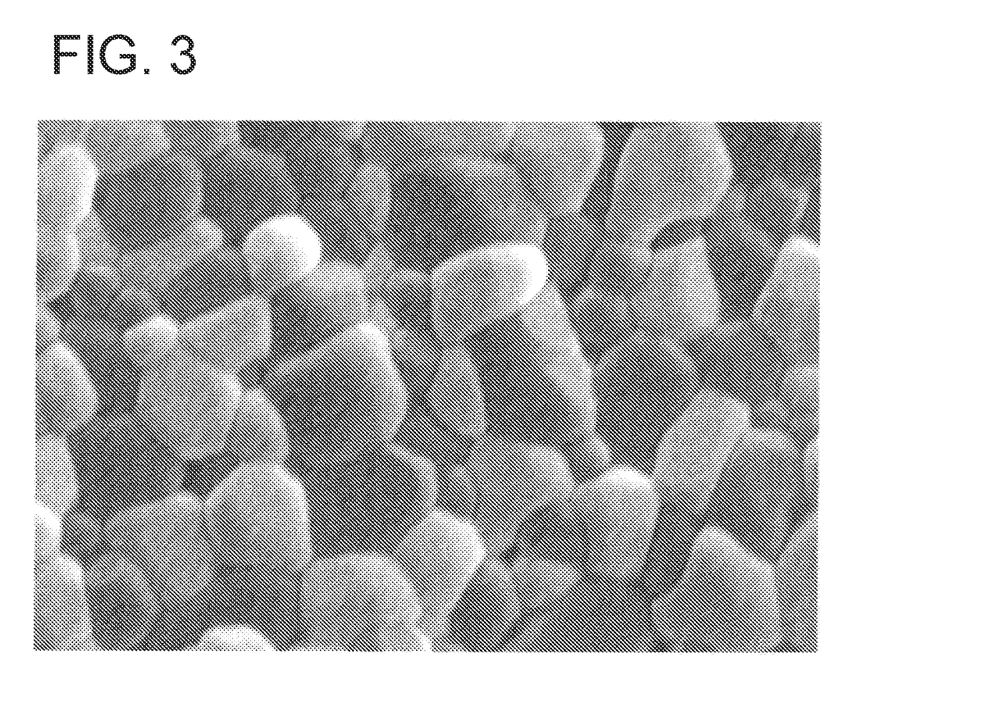
FIG. 3 is an enlarged sectional view, as a SEM image, of a portion A in FIG. 2.

A configuration of a light-emitting device 100 according to a first embodiment will be described with reference to FIGS. 1 and 2. FIG. 1 is a top view of the light-emitting device 100 according to the first embodiment, and FIG. 2 is a cross-sectional view of the light-emitting device 100 illustrated in FIG. 1, taken along line CS-CS. FIG. 3 is an enlarged sectional view as a SEM image of a light incident surface 40S of a wavelength conversion plate 40.

Light-emitting device 100 as a semiconductor light-emitting device includes: a substrate 10 which has a flat plate portion 11 and a frame 13; a light-emitting element 20 mounted on the flat plate portion 11 of the substrate 10; a wavelength conversion plate 40 mounted on the light-emitting element 20; a protective element 30 mounted on the flat plate portion 11 of the substrate 10, and a reflective resin 70 covering the side surfaces of the light-emitting element 20 and the wavelength conversion plate 40. In FIG. 1, for illustrating the structure of the interior of the light-emitting device 100, the reflective resin 70 is not illustrated.

The substrate 10 includes a flat plate portion 11 and a frame 13. The flat plate portion 11 is provided with a first wiring electrode 15 and a second wiring electrode 17 spaced apart on one surface of a plate-shaped base material. The frame 13 is provided on one surface of the flat plate portion 11 so as to surround the first wiring electrode 15 and the second wiring electrode 17. Hereinafter, the one surface of the flat plate portion 11 provided with the first wiring electrode 15 and the second wiring electrode 17 is referred to as an upper surface, and the other surface is referred to as a lower surface or a bottom surface. Furthermore, the upper surface side of the flat plate portion 11 is referred to as "above/upper (side)", and the lower surface side of the flat plate portion 11 is referred to as "below/lower (side)". Furthermore, the surface facing upward is referred to as an upper surface also in the light-emitting element 20 and the like mounted on the flat plate portion 11, and the surface facing downward is referred to as a lower surface or bottom surface also in the light-emitting element 20 and the like mounted on the flat plate portion 11. A recess/dent defined by the upper surface of the flat plate portion 11 and the inner wall surface of the frame 13 is also referred to as a cavity. The lower surface of the flat plate portion 11 also serves as the bottom surface of the light-emitting device 100.

The substrate 10 may be a molded body in which the flat plate portion 11 and the frame 13 are integrally molded, or may be an adhered body obtained by adhering the frame 13 formed separately to the flat plate portion 11.

Examples of the base material of the substrate 10 include insulative and high thermal conductive oxide ceramics and nitride ceramics such as alumina ($Al_2O_3$), aluminum nitride (AlN), silicon nitride ($Si_3N_4$), and the like. In addition, when the frame 13 is prepared separately, a portion of the frame 13 may be made of, for example, a resin such as an epoxy resin, a silicone resin, an acrylic resin, or a polycarbonate resin. Specifically, in the present embodiment, the base material of the substrate 10 was made of AlN, and a molded body in which the flat plate portion 11 and the frame 13 were integrally molded was used. A high thermal conductive substrate can efficiently transfer heat, generated by the wavelength conversion plate 40 and the light-emitting element 20 during energization, to the mounting substrate and dissipate the heat, and thus, it is preferable because the light-emitting device 100 to be described later can maintain a high light output maintenance rate.

The first wiring electrode 15 and the second wiring electrode 17 are disposed on the upper surface of the flat plate portion 11 of the substrate 10. The first wiring electrode 15 has a rectangular element mounting portion 15A for mounting the light-emitting element 20, a bonding portion 15B protruding from one side of the element mounting portion 15A, and a wiring portion 15C which is an partially separate protrusion from one side of the element mounting portion 15A. The second wiring electrode 17 is disposed to face the bonding portion 15B and the side of the element mounting portion 15A which is not connected to the wiring portion 15C.

The first wiring electrode 15 is electrically connected to the first mounting electrode 15D provided on the bottom surface of the flat plate portion 11 through a via wiring TH1 penetrating the base material of the flat plate portion 11 from the wiring portion 15C. The second wiring electrode 17 is electrically connected to the second mounting electrode 17D provided on the bottom surface of the flat plate portion 11 via a via-wiring TH2 penetrating the base material of the flat plate portion 11.

The first wiring electrode 15 and the second wiring electrode 17 are made of a metal material containing at least any one of, for example, copper (Cu), tungsten (W), and aluminum (Al). Furthermore, portions exposed on the upper surface and the bottom surface of the flat plate portion 11 of the first wiring electrode 15 and the second wiring electrode 17 includes laminated structure of nickel/gold (Ni/Au) in this order. Specifically, in the present embodiment, cupper (Cu) was used as the materials for the first wiring electrode 15 and the second wiring electrode 17.

The light-emitting element 20 is a light-emitting diode (LED) which is a semiconductor light-emitting element. The light-emitting element 20 has, for example, a structure in which a light-emitting functional layer 23 which has a thickness of about 4 µm to 6 µm is attached to one surface of a conductive support substrate 21, which has a thickness of about 100 µm and which is made of silicon (Si), via a reflecting electrode layer, where the light-emitting functional layer 23 is configured in such a manner that a p-type semiconductor layer, a light-emitting layer, and an n-type semiconductor layer are stacked. A side provided with the light-emitting functional layer 23 of the supporting substrate 21 is the upper surface of the light-emitting element 20, and the opposite side is the lower surface or the bottom surface of the light-emitting element 20. Furthermore, the surface opposite the reflective electrode layer of the light-emitting functional layer 23, i.e. the upper surface of the light-emitting functional layer 23 is to serve as an element light output surface 23S of the light-emitting element 20.

The light-emitting element 20 includes a junction electrode (not shown) on the bottom surface, and is bonded and electrically connected to the element mounting portion 15A of the first wiring electrode 15 via an element bonding layer 50. Furthermore, the light-emitting element 20 is provided with an electrode pad 25 on the upper surface, and is electrically connected to the second wiring electrode 17 via a bonding wire BW1. Therefore, the light-emitting element 20 can emit light by energizing the first mounting electrode 15D and the second mounting electrode 17D of the substrate 10.

As the light-emitting elements 20, LEDs or LDs (Laser Diode) that are capable of emitting light ranging from ultraviolet light to blue light can be used. Specifically, in the present embodiment, an LED that was capable of emitting blue light was used.

The protective element 30 is, for example, a reverse voltage protection element such as a zener diode. When overvoltage is applied from the outside to the light-emitting element 20 (e.g., by static electricity, etc.), the protective element 30 is caused to protect the light-emitting element 20. The protective element 30 is provided with a junction electrode (not shown) on the lower surface, and is bonded and electrically connected to the second wiring electrode 17 via an element bonding layer (not shown). Furthermore, the protective element 30 is provided with an electrode pad (not shown) on the upper surface, and is electrically connected to the bonding portion 15B of the first wiring electrode 15 via a bonding wire BW2.

The wavelength conversion plate 40 is a wavelength conversion element configured to convert received light to light which has a wavelength longer than the received light and emit the converted light. The wavelength conversion plate 40 has a plate shape and includes two principal surfaces, of which a lower surface is a light incident surface 40S and an upper surface is a light output surface 40T.

The wavelength conversion plate 40 herein is a polycrystalline sintered body obtained by sintering the fluorescent material particles and binder particles with the uniform particle diameter and shaping them into a plate shape. Specifically, in the present embodiment, each of the fluorescent material particles and the binder particles had a particle size of about 2 µm to 10 µm.

The light incident surface 40S of the wavelength conversion plate 40 has, as illustrated in FIG. 3, a sintered surface obtained by binding the fluorescent material particles and the binder particles, so that it has an irregular surface corresponding to the shape and particle size of the particles. Furthermore, on many of the particle surface of the light incident surface 40S, which is a sintered surface, facets (thermal stable surface of the crystal) are formed.

The light incident surface 40S of the wavelength conversion plate 40 can be made to include an irregular portion, a concave portion, and also a convex portion. Therefore, the following description will be given based on a surface including the top of the convex portion serving as a ground portion when the wavelength conversion plate 40 is mounted. Therefore, the surface properties of the light incident surface 40S will be described with reference to the surface having a concave portion 40R. In other words, the light incident surface 40S of the wavelength conversion plate 40, contains a dome-shaped concave portion 40R formed by a plurality of particle surfaces. Furthermore, the light incident surface 40S of the wavelength conversion plate 40 contains a polyhedral space formed by the surfaces of the concave portions 40R which are facets.

The wavelength conversion plate 40 on the side of the light incident surface 40S is adhered to the element light output surface 23S of the light-emitting functional layer 23 of the light-emitting element 20 via an adhesive layer 60. Here, the light output surface 40T of the wavelength conversion plate 40 functions as the light output surface of the light-emitting device 100.

The wavelength conversion plate 40 can be a polycrystalline sintered body including a YAG fluorescent material doped with cerium (Ce) or/and europium (Eu), a sialon fluorescent material, an oxynitride fluorescent material, and a silicon oxide fluorescent material.

Specifically, the wavelength conversion plate 40 used in the present embodiment was a polycrystalline sintered body including a fluorescent material particle of yttrium aluminum garnet doped with a cerium (Ce) activator ($Y_3Al_5O_{12}$: Ce, abbreviated as YAG:Ce) and an alumina ($Al_2O_3$) particle as a binder particle. The surface roughness ($R_Z$: maximum roughness) of the light incident surface 40S of the wavelength conversion plate 40 was 5 µm. The wavelength conversion plate 40 was adjusted so as to absorb part of blue light emitted from the light-emitting element 20 and emit yellow light, thus altering the light emitted from the light-emitting device 100 to white light.

The adhesive layer 60 is made of a resin that transmits light emitted from the light-emitting element 20, and adheres the element light output surface 23S of the light-emitting element 20 and the light incident surface 40S of the wavelength conversion plate 40. The adhesive layer 60 is a resin body made of a cured adhesive resin 60M obtained by dispersing resin particles 63, which are cured granular resins with a low elastic modulus, in a resin medium 61, which is an uncured liquid resin.

Figure 4:
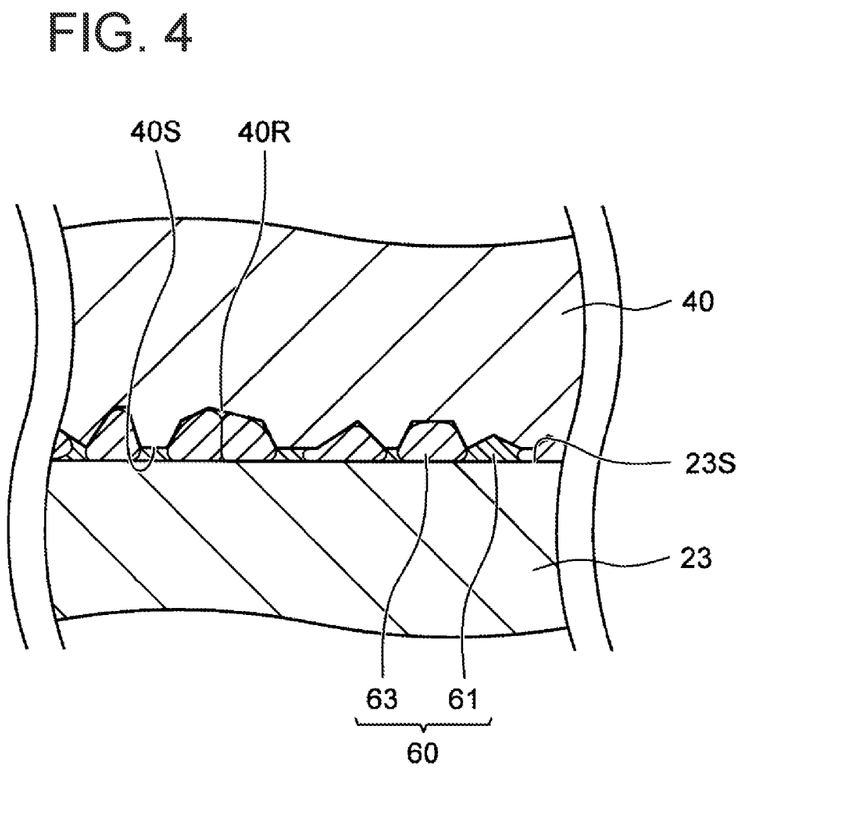
FIG. 4 is an enlarged view of a wavelength conversion plate of the light-emitting device according to the embodiment of the presently disclosed subject matter.

As illustrated in FIG. 4, the adhesive layer 60 is interposed between the element light output surface 23S of the light-emitting functional layer 23 and the light incident surface 40S of the wavelength conversion plate 40. The resin particles 63 are deformed by compression and fit into the polyhedral space, which is defined by the concave portions 40R of the light incident surface 40S of the wavelength conversion plate 40 and the element light output surface 23S of the light-emitting functional layer 23. Furthermore, a space other than the polyhedral space is filled with the resin medium 61.

Thus, by compressive deformation of the resin particles 63 by the dome-shaped concave portions 40R formed of the plurality of particle surfaces of the wavelength conversion plate 40, it is possible to increase the density of the resin particles 63, as well as to increase the refractive index. Thus, it is possible to improve the heat dissipation efficiency for dissipating heat generated in the wavelength conversion plate 40 to the light-emitting element 20. Furthermore, it is possible to reduce the refractive index difference between the light-emitting element 20 and the wavelength conversion plate 40, and to improve the optical coupling efficiency. Furthermore, since the concave portions 40R of the wavelength conversion plate 40 function as the facets, it is possible to increase the contact area between the wavelength conversion plate 40 and the resin particles 63, and also to improve the heat dissipation efficiency and/or optical coupling efficiency.

Thus, it is possible to suppress the temperature quenching phenomenon of the fluorescent material contained in the wavelength conversion plate 40, and also to maintain a high light output of the light-emitting device 100. Furthermore, it is possible to reduce the refractive index differences between the light-emitting element 20 and the resin particles 63 and between the resin particles 63 and the wavelength conversion plate 40, making it possible to improve the light output of the light-emitting device 100. In particular, the heat dissipation efficiency of the wavelength conversion plate 40 can be improved by increasing the contact area between the wavelength conversion plate 40, which is on a heat generation source side, and the resin particles 63.

Specifically, in the present embodiment, the adhesive layer 60 was made from a thermosetting silicone resin which was the same material used for the resin medium 61 and the resin particles 63. In addition, the resin medium 61 was an uncured liquid resin before the formation of the adhesive layer 60, and the resin particles 63 were resin particles 63 which had been heated and cured, before the formation of the adhesive layer 60.

Furthermore, the particle diameter ($\phi$) of the resin particles 63 was 2 μm since the surface roughness ($R_Z$) of the light incident surface 40S of the wavelength conversion plate 40 was 5 μm. The particle diameter ($\phi$) of the resin particles 63 may be 1/5 (1 μm) to 1/1 (5 μm) of the surface roughness ($R_Z$) of the wavelength conversion plate 40.

If the particle diameter ($\phi$) of the resin particle 63 is smaller than 1/5 of the surface roughness ($R_Z$), the light-emitting functional layer 23 of the light-emitting element 20 may be damaged by protruding portions of the light incident surface 40S of the wavelength conversion plate 40. Furthermore, if the particle size of the resin particles 63 ($\phi$) is greater than 1/1 of the surface roughness ($R_Z$), the resin particles 63 enter the interior of the concave portion 40R of the of the wavelength conversion plate 40 so as not to be deformed by compression.

The particle diameter ($\phi$) of the resin particles 63 is preferably 2/5 (2 μm) to 3/5 (3 μm) of the surface roughness ($R_Z$) of the wavelength conversion plate 40. This is because the average surface roughness (Ra: arithmetic average roughness, $R_{ZJIS}$: ten-point average roughness, etc.) of the sintered body composed of particles (for example, fluorescent material particles and alumina particles) which have uniform particle diameters is 2/5 to 3/5 of the surface roughness ($R_Z$: roughness in maximum height).

Furthermore, the amount of the resin particles 63 to be added is set at 1 wt % to 5 wt % by mass percent (or mass concentration) (wt %, mass of the resin particles 63/(mass of the resin particles 63+mass of the resin medium 61)×100). As a result, a single resin particle 63 can be formed so as to be in contact with both the element light output surface 23S of the light-emitting functional layer 23 and the light incident surface 40S of the wavelength conversion plate 40.

As illustrated in FIG. 2, the reflective resin 70 serving as a light reflection portion is filled in the cavity of the substrate 10 so as to seal the light-emitting element 20 and cover the side surface of the wavelength conversion plate 40. The reflective resin 70 is a resin material which has reflectivity with respect to light emitted from the light-emitting element 20 and light emitted from the wavelength conversion plate 40. The reflective resin 70 is filled in the cavity so as to expose the light output surface 40T, which is the upper surface of the wavelength conversion plate 40.

Specifically, in the present embodiment, the reflective resin 70 was a white resin obtained by dispersing titanium dioxide ($TiO_2$) as particles having light-scattering properties in a thermosetting silicone resin.

As described above, according to the present embodiment, the adhesive layer 60 that adheres the element light output surface 23S of the light-emitting functional layer 23 of the light-emitting element 20 and the light incident surface 40S of the wavelength conversion plate 40 is allowed to contain resin particles 63 with a size that allows the resin particle 63 to fit in the concave portions 40R of the light incident surface 40S of the wavelength conversion plate 40 and to be deformed by compression. Thus, the heat generated in the wavelength conversion plate 40 can be efficiently dissipated (heat transfer) to the light-emitting element 20.

Next, an example of a manufacturing procedure of the light-emitting device 100 will be described with reference to FIGS. 5 and 6.

Figure 5:
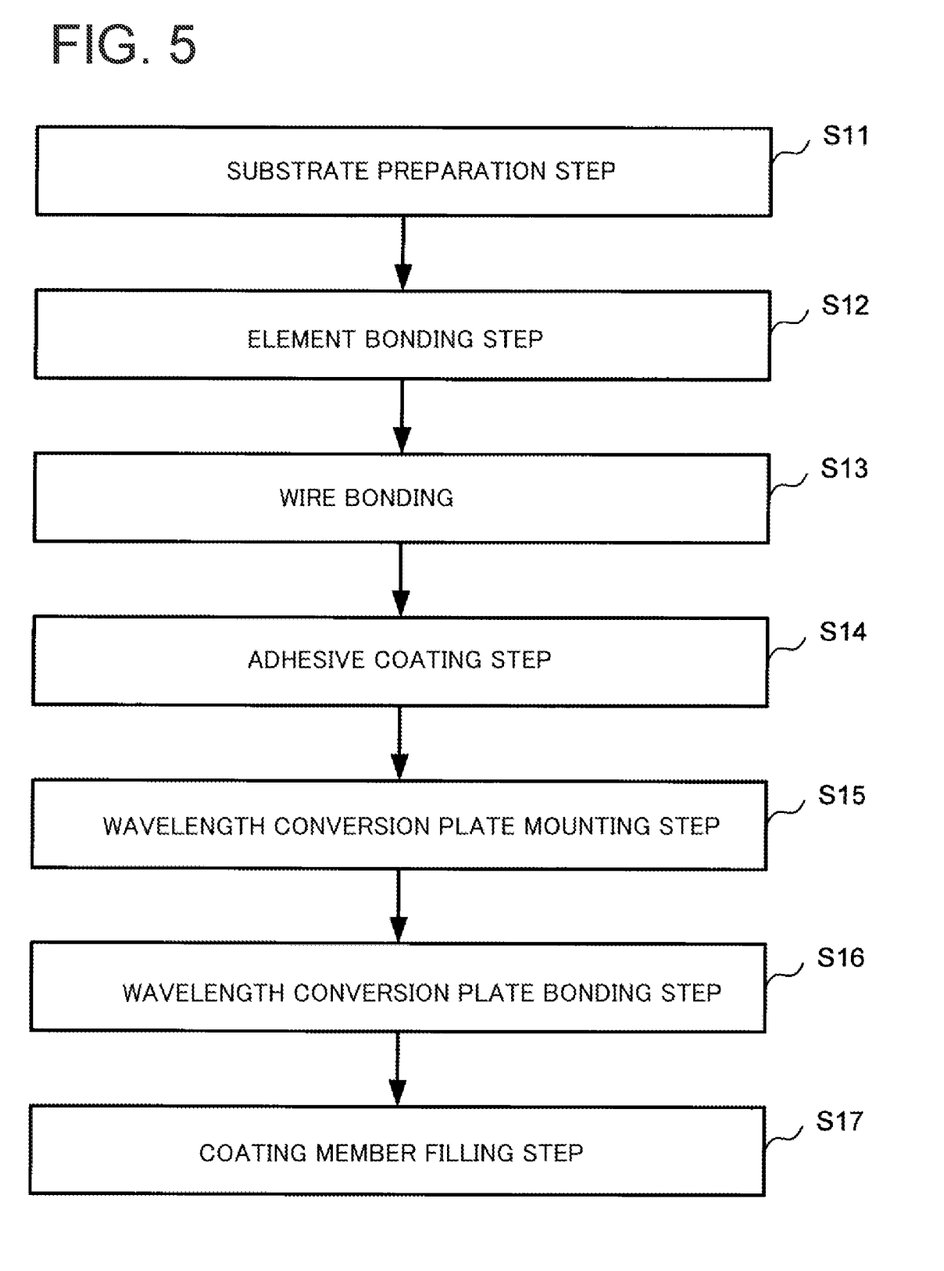
FIG. 5 is a diagram showing a flow of manufacturing the light-emitting device according to the embodiment of the presently disclosed subject matter.
Figure 6:
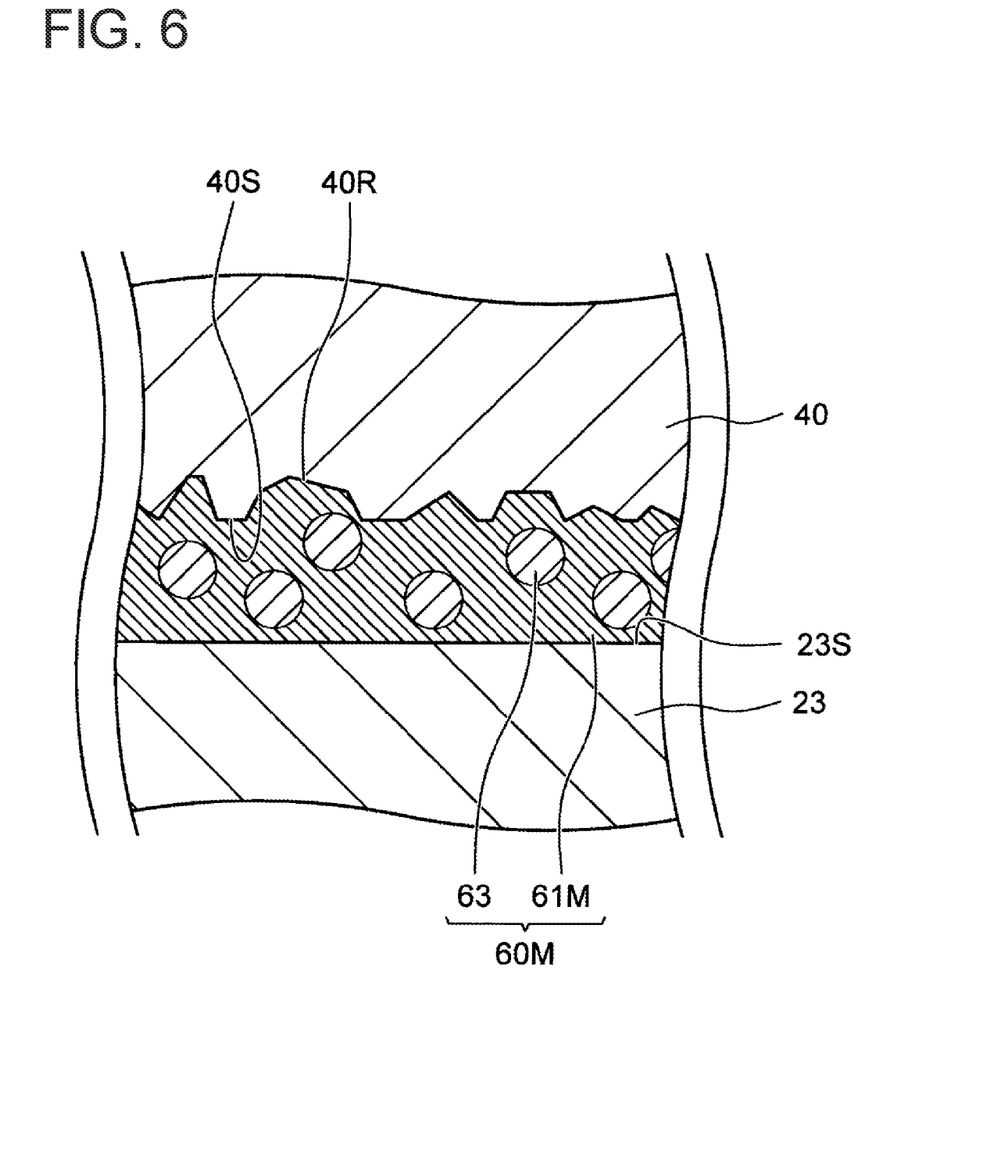
FIG. 6 is a cross-sectional view of the light-emitting device according to the embodiment of the presently disclosed subject matter in part at the time of manufacturing.

FIG. 5 is a diagram showing a process of manufacturing the light-emitting device 100 according to the embodiment of the presently disclosed subject matter. Furthermore, FIG. 6 is a cross-sectional view of the light-emitting device 100 in a stage where the wavelength conversion plate 40 is being mounted in a step S15 of the manufacturing procedure shown in FIG. 5. FIG. 6 is an enlarged cross-sectional view of a portion A of the light-emitting device 100 illustrated in FIG. 2.

A substrate preparation step is a step of preparing a substrate 10 as shown in FIGS. 1 and 2 (step S11). Specifically, in the prepared substrate 10, a first wiring electrode 15 and a second wiring electrode 17 were formed on the upper surface of a flat plate portion 11, which was a bottom surface of the cavity, and a frame 13 serving as a side wall of the cavity was provided on the upper surface of the flat plate portion 11. Furthermore, the first wiring electrode 15 included a rectangular element mounting portion 15A with a size which permitted a light-emitting element 20 to be mounted, a bonding portion 15B protruding from one side constituting the outer shape, and a wiring portion 15C which formed a partially separate protrusion from the other side. The second wiring electrode 17 was disposed to be opposite to the side of the element mounting portion 15A where the bonding portion 15B and the wiring portion 15C were not provided.

An element bonding step is a step of bonding the light-emitting element 20 to the upper surface of the element mounting portion 15A of the first wiring electrode 15, and bonding the protective element 30 to the end of the upper surface of the second wiring electrode 17, as illustrated in FIGS. 1 and 2 (step S12).

Specifically, first, the element mounting portion 15A of the first wiring electrode 15 and the end of the upper surface of the second wiring electrode 17 were coated with a gold-tin (Au—Sn) paste. Next, a bonding electrode (not illustrated) provided on the bottom surface of each of the light-emitting element 20 and the protective element 30 was pressed against the applied Au—Sn paste to be temporarily fixed. The substrate 10 in this state was overheated to 300° C. to melt and then solidify the Au—Sn paste, so that the light-emitting element 20 was fixed and electrically connected to the element mounting portion 15A and the protective element 30 was fixed and electrically connected to a predetermined location at the end of the second wiring electrode 17.

A wire bonding step is a step of connecting the electrode pad 25 of the light-emitting element 20 to the second wiring electrode 17 as well as connecting the electrode pad of the protective element 30 to the bonding portion 15B of the first wiring electrode 15, as illustrated in FIG. 1, with bonding wires BW1 and BW2, respectively (step S13).

Specifically, first, one end of the gold (Au) wire was connected to the upper surface of the second wiring electrode 17 and was raised upward until it reached the height of the electrode pad 25 of the light-emitting element 20. Then, the Au wire was bent so as to be horizontal with the upper surface of the flat plate portion 11 and was extended to the electrode pad 25 of the light-emitting element 20, so that the other end of the Au wire was connected to the electrode pad 25 to form a bonding wire BW1. Furthermore, the one end of the Au wire was connected to the electrode pad provided on the upper surface of the protective element 30 while being raised upward to form a loop and extend to the bonding portion 15B of the first wiring electrode 15. The other end of the Au wire was then connected to the bonding portion 15B to form a bonding wire BW2.

An adhesive coating step is a step of applying an adhesive resin 60M, to be a adhesive layer 60, to the element light output surface 23S of the light-emitting functional layer 23 of the light-emitting element 20 (step S14).

Specifically, first, 2 wt % of resin particles 63, which had a particle diameter of 2 μm and which were formed of a cured spherical silicone resin, were added to a resin medium 61M, which was an uncured silicone resin, to prepare an adhesive resin 60M.

Next, a predetermined amount of the adhesive resin 60M was dropped from a dropping nozzle and applied onto the element light output surface 23S of the light-emitting functional layer 23 of the light-emitting element 20. This step was terminated when the adhesive resin 60M extended to 40% to 60% of the area of the element light output surface 23S of the light-emitting functional layer 23.

The adhesive resin 60M obtained by adding 1 wt % to 5 wt % of the resin particles 63 can be easily wetted and spread over the element light output surface 23S of the light-emitting functional layer 23 after coating. Furthermore, since the resin medium 61M of the adhesive resin 60M and the resin particles 63 are made of the same type of silicone resin, the resin particles 63 after coating can be wetted and spread without sedimentation and aggregation.

In this manner, the coating step is not only the coating of the adhesive resin 60M on the element light output surface 23S of the light-emitting functional layer 23 but also a preliminary step for uniformly spreading the resin particles 63 contained in the adhesive resin 60M.

Note that the amount of the resin particles 63 added can be set to 5 wt % or more, so long as the coating method is a method in which the resin particles 63 can be uniformly applied to the element light output surface 23S of the light-emitting functional layer 23, for example, a method in which the resin particles are applied by a spray gun, a method in which a solvent is dried after the adhesive resin 60M diluted with a solvent is applied on the entire surface, and the like.

A wavelength conversion plate mounting step is a step of mounting the wavelength conversion plate 40 on the adhesive resin 60M coated on the element light output surface 23S of the light-emitting functional layer 23 of the light-emitting element 20 (step S15).

Specifically, on the upper surface of the adhesive resin 60M spread to a predetermined area by applying the adhesive resin 60M to the element light output surface 23S of the light-emitting functional layer 23 in step S14, the light incident surface 40S of the wavelength conversion plate 40 was mounted so as to be in contact therewith. At this time, as illustrated in FIG. 6, the adhesive resin 60M spreaded between the element light output surface 23S of the light-emitting functional layer 23 and the light incident surface 40S of the wavelength conversion plate 40 with the spherical resin particles 63 dispersed in the resin medium 61.

Thereafter, the wavelength conversion plate 40 was pressed from above for about 0.5 seconds with a load of about 40 g/mm². By this operation, as illustrated in FIG. 4, the adhesive resin 60M spread gaplessly between the element light output surface 23S of the light-emitting functional layer 23 and the light incident surface 40S of the wavelength conversion plate 40. Furthermore, the resin particles 63 were deformed by compression while being spread into the concave portions 40R of the light incident surface 40S of the wavelength conversion plate 40, so that the light incident surface 40S of the wavelength conversion plate 40 and the element light output surface 23S of the light-emitting functional layer 23 were in close contact with each other via the adhesive resin 60M.

In the present embodiment, for example, the elastic modulus of the silicone resin as the resin particles 63 can be 1 MPa to 2 MPa, the elastic modulus of alumina crystals as the binder of the wavelength conversion plate 40 can be 300 GPa to 400 GPa, and the elastic modulus of GaN as the main constituent of the light-emitting functional layers 23 of the light-emitting element 20 can be 150 GPa to 200 GPa. In this manner, the resin particles 63 can be made softer than the wavelength conversion plate 40 and the light-emitting functional layers 23. Thus, the resin particles 63 can be compressed and deformed when the wavelength conversion plate 40 is pressed at about 40 g/mm² to increase the density of the resin particles 63. At the same time, the resin particles 63 also function as a pressing buffer, and can prevent the light-emitting functional layer 23 from being damaged by the pressing. Resin particles 63 with the elastic modulus in the range of 1 MPa to 10 MPa can satisfactorily exhibit the advantageous effects.

The wavelength conversion plate 40 of the present embodiment was a plate material formed of a sintered body obtained by kneading a YAG:Ce fluorescent raw material and binder particles of alumina, forming a sheet from this kneaded product, and sintering the sheet. The light incident surface 40S of the wavelength conversion plate 40 thus formed had, as illustrated in FIG. 3, the concave portions 40R formed of a sintered surface which have facets by the fluorescent material particles and binder particles. The surface roughness $R_Z$ of the light incident surface 40S of the wavelength conversion plate 40 was 5 μm.

The wavelength conversion plate bonding step is a step of heat-treating the substrate 10 in a state after step S15 to cure the resin medium 61M of the adhesive resin 60M to form the adhesive layer 60 (step S16).

Specifically, the element light output surface 23S of the light-emitting functional layer 23 of the light-emitting element 20, the light incident surface 40S of the wavelength conversion plate 40, the resin particles 63 that were in close contact with both surfaces and which were deformed by compression, and the uncured resin medium 61M that filled in the other spaces were all cured by heat treatment at 150° C. for 15 minutes.

This operation could form the adhesive layer 60 that maintained the resin particles 63 in a state of being deformed by compression and of, at the same time, being in close contact with both the element light output surface 23S of the light-emitting functional layer 23 and the light incident surface 40S of the wavelength conversion plate 40. That is, this step is a step of fixing the resin particles 63 which are compressed and deformed to have a higher density than the resin medium 61. In other words, the step is a step of forming a resin body which has a high density portion in a section that is in contact with the element light output surface 23S of the light-emitting functional layer 23 and the light incident surface 40S of the wavelength conversion plate 40.

The refractive index of the resin particles 63 with such a higher density becomes higher than that of the medium resin. Specifically, the refractive index of the silicone resin, which is the resin medium 61, after curing is about 1.4, and the refractive index of the resin particles 63 increases to a value of about 1.4 or more. Therefore, the difference in refractive index between GaN, which is the main constituent of the light-emitting functional layer 23, (about 2.5) and alumina, which is the binder of the wavelength conversion plate 40, (about 1.7) can be reduced, so that the light output of the light-emitting device 100 can be improved.

As illustrated in FIG. 2, a coating member filling step is a step of filling the cavity, defined by the upper surface of the flat plate portion 11 and the inner wall surface of the frame 13, with the reflective resin 70 (step S17).

Specifically, first, a silicone resin, to be the reflective resin 70, in which titanium dioxide ($TiO_2$) nanoparticles were dispersed, was filled and injected into the cavity of the substrate 10 so as to cover the outer surface of the wavelength conversion plate 40 and expose the light output surface 40T (upper surface). Then, the silicone resin was cured by heat treatment at 150° C. for 120 minutes to form the reflective resin 70.

This operation could seal the first and second wiring electrodes 15 and 17, which were provided on the bottom surface of the cavity of the substrate 10, the light-emitting element 20, the protective element 30, the bonding wire BW1 and BW2, and the side surface of the wavelength conversion plate 40.

As described above, according to the manufacturing method of the present embodiment, the semiconductor light-emitting device can be manufactured by performing the processes from steps S11 to S17. In particular, the adhesive resin 60M in which the cured resin particles 63 are mixed is prepared, the adhesive resin 60M is uniformly wetted and spread between the element light output surface 23S of the light-emitting element 20 and the light incident surface 40S of the wavelength conversion plate 40, and the wavelength conversion plate 40 is pressed. As a result, the resin particles 63 mixed in the adhesive resin 60M can be compressed and deformed into the polyhedral space formed by the surfaces of the concave portions 40R of the light incident surface 40S of the wavelength conversion plate 40, and fitted into the polyhedral space.

Next, second and third embodiments and comparative example will be described. The second and third embodiments and comparative example are the same as the first embodiment in that the same substrate 10, light-emitting element 20, wavelength conversion plate 40, reflective resin 70 and the like are used except that the addition amount (including zero) of the resin particles 63 of the adhesive layer 60. Therefore, only differences will be described.

Second Embodiment

A light-emitting device according to the second embodiment is manufactured by the same manner as that of the first embodiment except that the amount of the resin particles 63 added in the adhesive layer 60 is reduced from 2 wt % to 1 wt %.

Third Embodiment

A light-emitting device according to the third embodiment is manufactured by the same manner as that of the first embodiment except that the amount of the resin particles 63 added in the adhesive layer 60 is increased from 2 wt % to 5 wt %.

COMPARATIVE EXAMPLE

A light-emitting device according to the comparative example is manufactured by the same manner as that of the first embodiment except that the amount of the resin particles 63 added in the adhesive layer 60 is decreased from 2 wt % to 0 wt %, meaning that the resin particles 63 are not added. Furthermore, the load in the pressing process against the wave conversion plate 40 in step S15 of the manufacturing method is reduced from about 50 g/mm² to about 10 g/mm². This operation prevents damage to the light-emitting functional layer 23 due to the pressing of the light incident surface 40S of the wavelength conversion plate 40.

Next, the light emission characteristics of the light-emitting devices of the first to third embodiments and comparative example were compared. Herein, the light-emitting device 100 of the first embodiment will be referred to as a sample 1, the light-emitting device of the second embodiment will be referred to as a sample 2, the light-emitting device of the third embodiment will be referred to as a sample 3, and the light-emitting device of the comparative example will be referred to as a sample 4.

Figure 7:
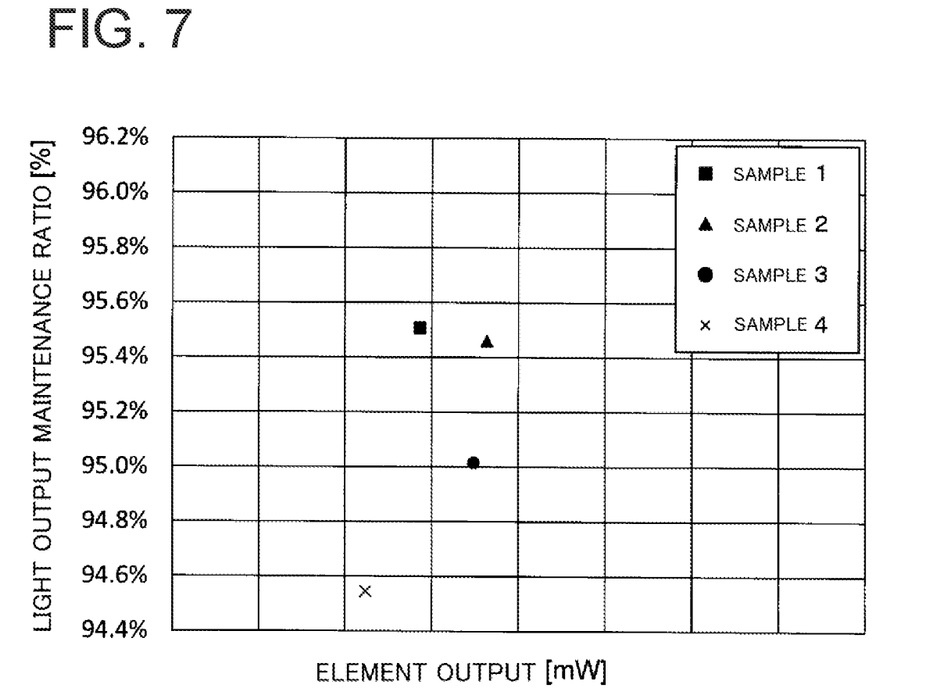
FIG. 7 is a graph showing the light output maintenance ratio of the light-emitting device according to the embodiment of the presently disclosed subject matter and a comparative example.

FIG. 7 is a graph showing light emission characteristics of the light-emitting devices. The horizontal axis represents the element output of the light-emitting device. Specifically, the horizontal axis represents the light output (mW) at the time of applying a predetermined current to the light-emitting device after step S13. Furthermore, the vertical axis represents the light output maintenance ratio of the light-emitting device after manufacture (%). Specifically, a value is obtained by dividing a light flux value (lm: lumen) when a current of 200 milliseconds is applied by a light flux value (lm) when a current of 20 milliseconds is applied as a reference (denominator), and then multiplying the resulting value by 100. This value represents the magnitude of a change in light emission characteristics due to heat generation of the light-emitting device, and means that the closer the value is to 100%, the smaller the effect of heat generation is.

The emission wavelength ($\lambda$) of the light-emitting element 20 used in the light-emitting devices of the embodiments and the comparative example is in a range from 448 nm to 449 nm. Furthermore, the wavelength conversion plate 40 is a fluorescent material plate obtained by sintering YAG:Ce fluorescent material particles and binder particles of alumina. As shown in FIG. 3, the particle arrangement in the light incident surface 40S is homogeneous, and the roughness of 1 mm square ($R_z$) is 5 µm.

Specifically, the element output and the light output maintenance ratio of Samples 1 to 4 prepared using such members were 1463 mW and 95.5% in Sample 1 (the first embodiment), 1463 mW and 95.5% in Sample 2 (the second embodiment), 1460 mW and 95.0% in Sample 3 (the third embodiment), and 1454 mW and 94.5% in Sample 4 (Comparative Example).

It can be seen that the light output maintenance ratios of Samples 1, 2, and 3 of the embodiments are 0.5% to 1.0% greater than the optical output maintenance ratio of Sample 4 of the comparative example. The difference in the light output maintenance ratio further increases, for example, by extending the current application time. As described above, the light-emitting device according to the present embodiments can decrease thermal influence more than the light-emitting device of the comparative example, and can maintain the high light output.

Note that, even when hard particles such as glass particles were added to the resin medium 61 instead of the resin particles 63, the effect as in the present embodiment could not be obtained. It is supposed that it is impossible to compressively deform hard particles such as glass particles and fit them in the concave portions 40R of the light incident surface 40S of the wavelength conversion plate 40.

As described above, according to the presently disclosed subject matter, it is possible to provide the light-emitting device 100 that is capable of reducing the heat generated from the wavelength converter during the operation of the light-emitting device 100 and of maintaining the high light output of the light-emitting device 100 as well as the manufacturing method thereof. In addition, according to the presently disclosed subject matter, it is possible to provide the light-emitting device 100 which is capable of reducing the optical coupling loss of the light-emitting device 100 and of increasing the light output of the light-emitting device 100 as well as the manufacturing method thereof.

While the embodiments of the presently disclosed subject matter have been described above, these embodiments are merely presented as examples and the presently disclosed subject matter is not limited to the embodiments.

For example, in the present embodiments, the case where the light-emitting element 20 is an LED has been described, and the light-emitting element 20 may be a surface emitting laser. In addition, in the manufacturing method, the adhesive resin 60M serving as the adhesive layer 60 is cured by the heat treatment in the wavelength conversion plate adhesive step, but it may be omitted as appropriate and the adhesive resin 60M may be cured by a heat treatment of the subsequent coating member filling step.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
a substrate having a wiring electrode;
a semiconductor light-emitting element which is mounted on the wiring electrode of the substrate, the semiconductor light-emitting element having a light-emitting functional layer with an upper surface exposed;
a wavelength conversion plate which is mounted on the light-emitting functional layer of the semiconductor light-emitting element, the wavelength conversion plate being made of a sintered body including fluorescent material particles and binder particles; and
an adhesive layer including a resin medium, which is configured to adhere the wavelength conversion plate on a side of a light-incident surface thereof to the light-emitting functional layer of the semiconductor light-emitting element on a side of a light output surface thereof, and resin particles dispersed in the resin medium, wherein
the light-incident surface of the wavelength conversion plate exposes a sintered surface of the sintered body with a concave portion, and
the resin particles are fitted in the concave portion of the light-incident surface of the wavelength conversion plate and compressively deformed.

2. The semiconductor light-emitting device according to claim 1, wherein the wavelength conversion plate has a facet in the light-incident surface.

3. The semiconductor light-emitting device according to claim 2, wherein the concave portion of the light-incident surface of the wavelength conversion plate has a surface defining a polyhedron space.

4. The semiconductor light-emitting device according to claim 3, wherein the resin particles have a density and a refractive index, and at least one of the density and the refractive index is greater than that of the resin medium.

5. The semiconductor light-emitting device according to claim 2, wherein the resin particles have a density and a refractive index, and at least one of the density and the refractive index is greater than that of the resin medium.

6. The semiconductor light-emitting device according to claim 2, wherein the resin particles and the resin medium are made of the same resin.

7. The semiconductor light-emitting device according to claim 1, wherein the concave portion of the light-incident surface of the wavelength conversion plate has a surface defining a polyhedron space.

8. The semiconductor light-emitting device according to claim 7, wherein the resin particles have a density and a refractive index, and at least one of the density and the refractive index is greater than that of the resin medium.

9. The semiconductor light-emitting device according to claim 7, wherein the resin particles and the resin medium are made of the same resin.

10. The semiconductor light-emitting device according to claim 1, wherein the resin particles have a density and a refractive index, and at least one of the density and the refractive index is greater than that of the resin medium.

11. The semiconductor light-emitting device according to claim 10, wherein the resin particles and the resin medium are made of the same resin.

12. The semiconductor light-emitting device according to claim 1, wherein the resin particles and the resin medium are made of the same resin.

13. The semiconductor light-emitting device according to claim 12, wherein the resin particles and the resin medium are made of a silicone resin.

14. The semiconductor light-emitting device according to claim 1, wherein an average particle diameter of the resin particles is 1/5 to 1/1 of a surface roughness (RZ) of the wavelength conversion plate.

15. A method for manufacturing a semiconductor light-emitting device comprising:
 a substrate preparation step of preparing a substrate having a wiring electrode;
 an element bonding step of bonding a semiconductor light-emitting element on the wiring electrode of the substrate;
 an adhesive coating step of applying an adhesive resin, which includes an uncured thermosetting resin medium having fluidity, and cured thermosetting resin particles dispersed in the resin medium, to an upper surface of the semiconductor light-emitting element;
 a wavelength conversion plate mounting step of mounting and pressing a wavelength conversion plate, made of a sintered body including fluorescent material particles and binder particles, on the adhesive resin, the wavelength conversion plate having a concave portion of a sintered surface on a surface opposite to the semiconductor light-emitting element; and
 a wavelength conversion plate bonding step of thermally curing the resin medium to bond the wavelength conversion plate and the semiconductor light-emitting element, wherein
 the wavelength conversion plate mounting step includes pressing the wavelength conversion plate from above in order to fit the resin particles into the concave portion of the wavelength conversion plate and compressively deforming the resin particles.

16. The method for manufacturing a semiconductor light-emitting device according to claim 15, wherein the resin particles are dispersed in the resin medium in a mass concentration of 1 wt % to 5 wt %.

17. The method for manufacturing a semiconductor light-emitting device according to claim 16, wherein the resin particles have a smaller elastic modulus than those of the semiconductor light-emitting element and the wavelength conversion plate, and are dispersed in the resin medium.

18. The method for manufacturing a semiconductor light-emitting device according to claim 15, wherein the resin particles have a smaller elastic modulus than those of the semiconductor light-emitting element and the wavelength conversion plate, and are dispersed in the resin medium.

* * * * *